United States Patent
Wang et al.

(10) Patent No.: US 10,844,995 B1
(45) Date of Patent: Nov. 24, 2020

(54) DISPLAY APPARATUS FOR A WINDOW ASSEMBLY

(71) Applicant: DYNASCAN TECHNOLOGY CORP., Taoyuan (TW)

(72) Inventors: Tsun-I Wang, Taoyuan (TW);
Ching-Chun Wu, Taoyuan (TW);
Chia-Liang Yang, Taoyuan (TW);
Chih-Chin Hsu, Taoyuan (TW)

(73) Assignee: DYNASCAN TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/576,514

(22) Filed: Sep. 19, 2019

(51) Int. Cl.
| | |
|---|---|
| *H05K 7/02* | (2006.01) |
| *H05K 7/04* | (2006.01) |
| *F16M 11/04* | (2006.01) |
| *E06B 7/28* | (2006.01) |
| *H05K 5/02* | (2006.01) |
| *H05K 5/00* | (2006.01) |
| *F16M 13/02* | (2006.01) |

(52) U.S. Cl.
CPC ............ *F16M 11/043* (2013.01); *E06B 7/28* (2013.01); *F16M 13/022* (2013.01); *H05K 5/0017* (2013.01); *H05K 5/0204* (2013.01)

(58) Field of Classification Search
USPC .................. 361/807, 809, 810; 49/231, 228; 381/333, 387, 790
See application file for complete search history.

(56) References Cited

U.S. PATENT DOCUMENTS

| | | | | |
|---|---|---|---|---|
| 5,136,419 | A * | 8/1992 | Shabrang | G02F 1/161 252/582 |
| 6,268,998 | B1 * | 7/2001 | Cho | G06F 1/1601 248/917 |
| 6,819,550 | B2 * | 11/2004 | Jobs | F16M 11/14 248/183.3 |
| 7,369,672 | B2 | 5/2008 | Hirschhorn | |
| 9,980,397 | B2 | 5/2018 | Gu et al. | |
| 10,480,706 | B2 * | 11/2019 | Sanders | F16M 11/2021 |
| 2003/0137715 | A1 * | 7/2003 | Poll | E06B 3/66366 359/275 |
| 2010/0277803 | A1 * | 11/2010 | Pockett | G02B 27/0081 359/567 |

FOREIGN PATENT DOCUMENTS

| | | |
|---|---|---|
| CN | 206669268 U | 11/2017 |
| FR | 3004783 | 4/2018 |

* cited by examiner

*Primary Examiner* — Hung S. Bui
(74) *Attorney, Agent, or Firm* — Duane Morris LLP

(57) ABSTRACT

The present disclosure relates to display apparatuses arranged for a window assembly. A display apparatus to be arranged between two panes is provided. The display apparatus comprises a display module, a base, an adjustable arm, and a bracket. The base is be secured to a wall. The adjustable arm has a first end and a second end. The second end is connected to the base. The bracket is attached to the display module. The first end of the adjustable arm is connected to the display module through the bracket, so that the display module can be removably arranged within or outside of a space between the two panes. A thickness of the display module and a thickness of the adjustable arm are smaller than a distance between the two panes.

9 Claims, 15 Drawing Sheets

DISPLAY APPARATUS FOR A WINDOW ASSEMBLY

BACKGROUND

1. Field of the Disclosure

The present disclosure relates to a display apparatus. More particularly, the present disclosure relates to a display apparatus to be arranged for a window assembly.

2. Description of the Related Art

Many restaurants may provide drive-through food service. In a drive-through lane, an employee stands behind a window and handles a customer's order. In some cases, panes of the window may be used to post some bills. If the bills are posted on the panes, cleaning the panes becomes difficult.

Some restaurants use a liquid crystal display to show advertisements instead of bills although the liquid crystal display needs more space than the bills. In this case, how to arrange the liquid crystal display properly is a big issue since the space behind the service window may be very limited. Furthermore, due to fire regulations, the structure of the service window which is set for a drive-through lane or set within a wall of a restaurant or a store must not be modified. That is, it may not be permissible under relevant fire regulations to attach the liquid crystal display on the service window. Thus, the arrangement of the liquid crystal display for the service window is a big issue.

SUMMARY

In view of the above, the present disclosure provides a display apparatus to be arranged between two panes of the service window. Such arrangement at least has the advantage of space-saving without changing the structure of the service window.

In one aspect according to some embodiments, a display apparatus to be arranged between two panes comprises: a display module; a base to be secured to a wall; an adjustable arm having a first end and a second end, wherein the second end is connected to the base; and a bracket attached to the display module, wherein the first end of the adjustable arm is connected to the display module through the bracket, so that the display module can be removably arranged within or outside of a space between the two panes, wherein a thickness of the display module and a thickness of the adjustable arm are smaller than a distance between the two panes.

According to the present disclosure, the display module can be easily moved with the adjustable arm. Therefore, the service window can be cleaned easily when the display module is moved outside of the space between the two panes.

According to the present disclosure, a base of the display apparatus is secured to a wall, instead of the service window. Therefore, such arrangement would not change the structure of the service window, and thus it would not violate the fire regulations or other regulations related to the service window.

In a preferred embodiment, the display apparatus further comprises a control circuit. The control circuit is disposed in the base, and a cable may be arranged within the adjustable arm for connecting the display apparatus and the control circuit in the base. Since the control circuit is not disposed within the display apparatus, the size or thickness of the display apparatus can be reduced so that the display apparatus can be arranged between two panes.

In a preferred embodiment, the bracket is L-shaped and comprises a first portion and a second portion vertical to the first portion. The first portion of the bracket is attached to a back surface of the display module. The second portion of the bracket is attached to a side of the display module. The first end of the adjustable arm is connected to the second portion of the bracket. With such arrangement, the display module can be firmly fixed to the adjustable arm.

BRIEF DESCRIPTION OF THE DRAWINGS

For a better understanding of the nature and objects of some embodiments of the present disclosure, reference should be made to the following detailed description taken in conjunction with the accompanying drawings. In the drawings, identical or functionally identical elements are given the same reference numbers unless otherwise specified.

DETAILED DESCRIPTION

Figure 1:
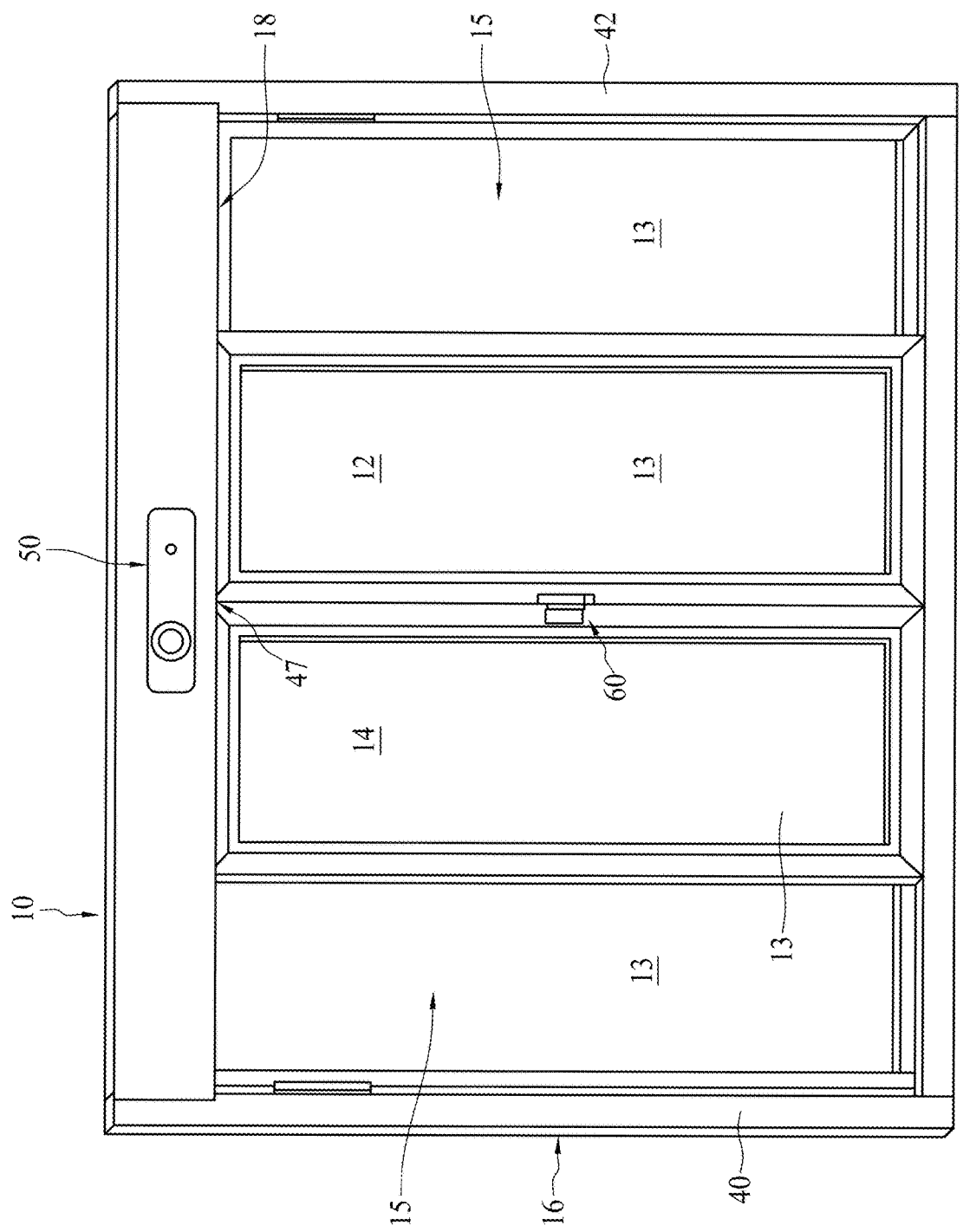
FIG. 1 illustrates a front view of a window assembly according to some embodiments of the present disclosure.
Figure 2:
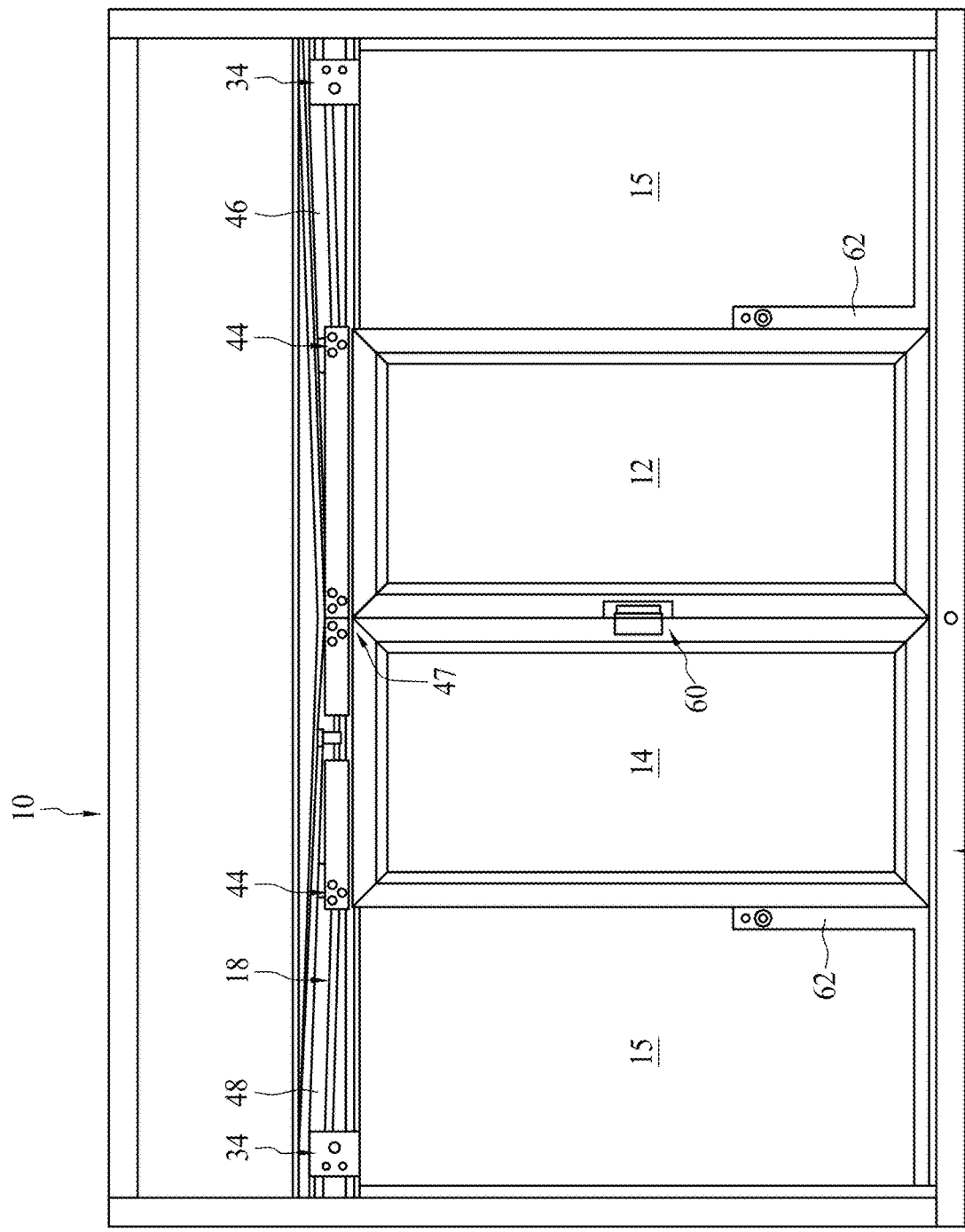
FIG. 2 illustrates a partially-revealed front view of a window assembly according to some embodiments of the present disclosure.
Figure 3:
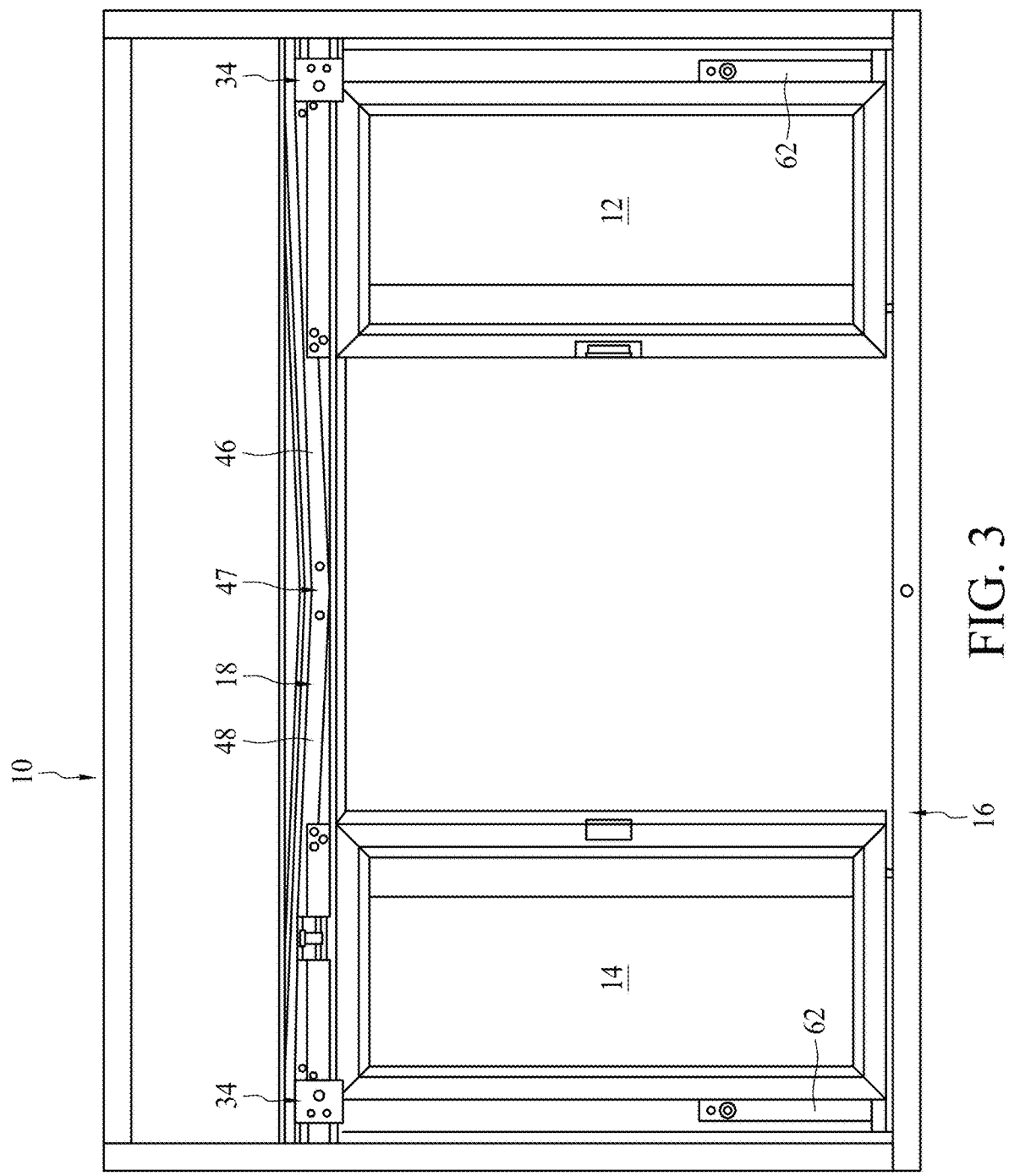
FIG. 3 illustrates a partially-revealed front view of a window assembly according to some embodiments of the present disclosure.

Referring to FIGS. 1-3, there is shown a window assembly 10 for service. The window assembly 10 generally includes doors 12 and 14, a window frame 16 for supporting the doors 12 and 14, and a track 18 attached to the window frame 16. The doors 12 and 14 are slidably mounted on the track 18 and are each moveable between an open position (FIG. 3) and a closed position (FIG. 1 or FIG. 2). The window frame 16 is adapted to be mounted inside a wall, allowing the window assembly 10 to provide access to the exterior of a building or another room within the building. The window frame 16 includes side members 40 and 42.

In some cases, a restaurant may use the window frame 15 to provide drive-through food service. For example, a user (e.g., an employee) standing within the building can handles a customer's order in a drive-through lane. The window assembly 10 is designed to be operated by a user on one side of the window assembly 10. By default, the doors 12 and 14 are in the closed positions, due to the biasing imparted by the inclined track 18. To open the doors 12 and 14, the user manually pulls one or both of the doors 12 and 14 to the open position. In some embodiments, the user need only pull one of the doors 12 and 14 to the open position, since the pulley assembly 34 will move the other door 12 or 14 in unison with the moving door 12 or 14. If the latch 60 and/or the lock bars 62 are engaged, the user will have to disengage the mechanism(s) before opening the doors 12 and 14.

The doors 12 and 14 are mounted on the track 18 in a side-by-side arrangement, as illustrated in FIGS. 1-3. In the embodiment shown, the doors 12 and 14 move in opposing directions between their respective open and closed positions. FIGS. 1 and 2 illustrate the doors 12 and 14 both in the closed positions, and the doors 12 and 14 meet proximate to the center point 47 of the track 18. FIG. 3 illustrates the movement of the doors 12 and 14 to the open positions. Each door 12 and 14 preferably holds a pane 13 of glass, permitting visibility through the doors 12 and 14. Additionally, fixed panels 15 are positioned within the frame on the sides of the doors 12 and 14 to seal the window assembly 10. These fixed panels 15 also preferably each hold a pane 13 (which may be made of glass) for visibility purposes. The doors 12 and 14 pass by the fixed panels 15 in parallel relation thereto when the doors 12 and 14 are opened and closed.

The track 18 is mounted to the window frame 16, and the doors 12 and 14 are slidably mounted on the track 18 by roller assemblies 44. In one embodiment, the track 18 is C-shaped or G-shaped in cross section, and each of the roller assemblies 44 includes one or more rollers (not shown) that ride within the track 18. Still further, the track 18 may contain two members extending along parallel planes, and the roller assemblies 44 may have rollers that ride within each track member. As shown in FIGS. 2 and 3, the track 18 may be mounted at an inclined angle, biasing the doors 12 and 14 to the closed position. In the embodiment shown in FIGS. 2 and 3, the track 18 includes arms 46 and 48 extending in opposite directions from a center point 47. The door 12 is coupled to the arm 46 by one of the roller assemblies 44 and the door 14 is coupled to the arm 48 by another of the roller assemblies 44. The arm 46 and the arm 48 are each inclined downwardly toward the center point 47 to gravitationally bias the doors 12 and 14 toward the center point 47, and thus, toward the closed positions. The downwardly-angled arms 46, 48 cause the track 18 shown in FIGS. 2 and 3 to exhibit a "V-shape." An example of the track 18 and the roller assemblies 44 is shown and described in greater detail in U.S. Pat. No. 5,970,657, which is incorporated by reference herein and made part hereof. Because the doors 12 and 14 are biased toward the closed positions, the doors 12 and 14 will close automatically, unless restrained by a greater force.

The track 18 shown in FIGS. 2-5 is adjustable to control the incline of each arm 46, 48, which in turn controls the biasing force biasing the doors 12 and 14 toward the closed positions. In one embodiment, each arm 46 and 48 has an adjustment screw (not shown) at the distal end opposite the center point 47, and the height of the distal end of each arm can be adjusted by turning the screw in an appropriate direction. In other embodiments, the track 18 may be adjustable by a different manual or automatic adjustment mechanism.

In one preferred embodiment, the doors 12 and 14 are operably connected to each other such that the doors 12 and 14 move in unison between the respective open and closed positions. In the embodiment shown in FIGS. 2 and 3, a pulley assembly 34 operably connects the doors 12 and 14 to move the doors 12 and 14 in unison between the respective open and closed positions. When one of the doors 12 and 14 is pulled open, such as by a user, the pulley assembly 34 operates to pull open the other of the doors 12 and 14. The pulley assembly 34 also operates to hold one door 12 or 14 in the open position when the other door 12 or 14 is held open by a direct force. The gravitational bias imparted by the inclined track 18 returns the doors 12 and 14 to the closed positions. In other embodiments, a different mechanism may be used to operably connect the doors 12 and 14. For example, in one embodiment, the doors 12 and 14 may be opened and/or closed by an automated electrical or mechanical mechanism.

Figure 4:
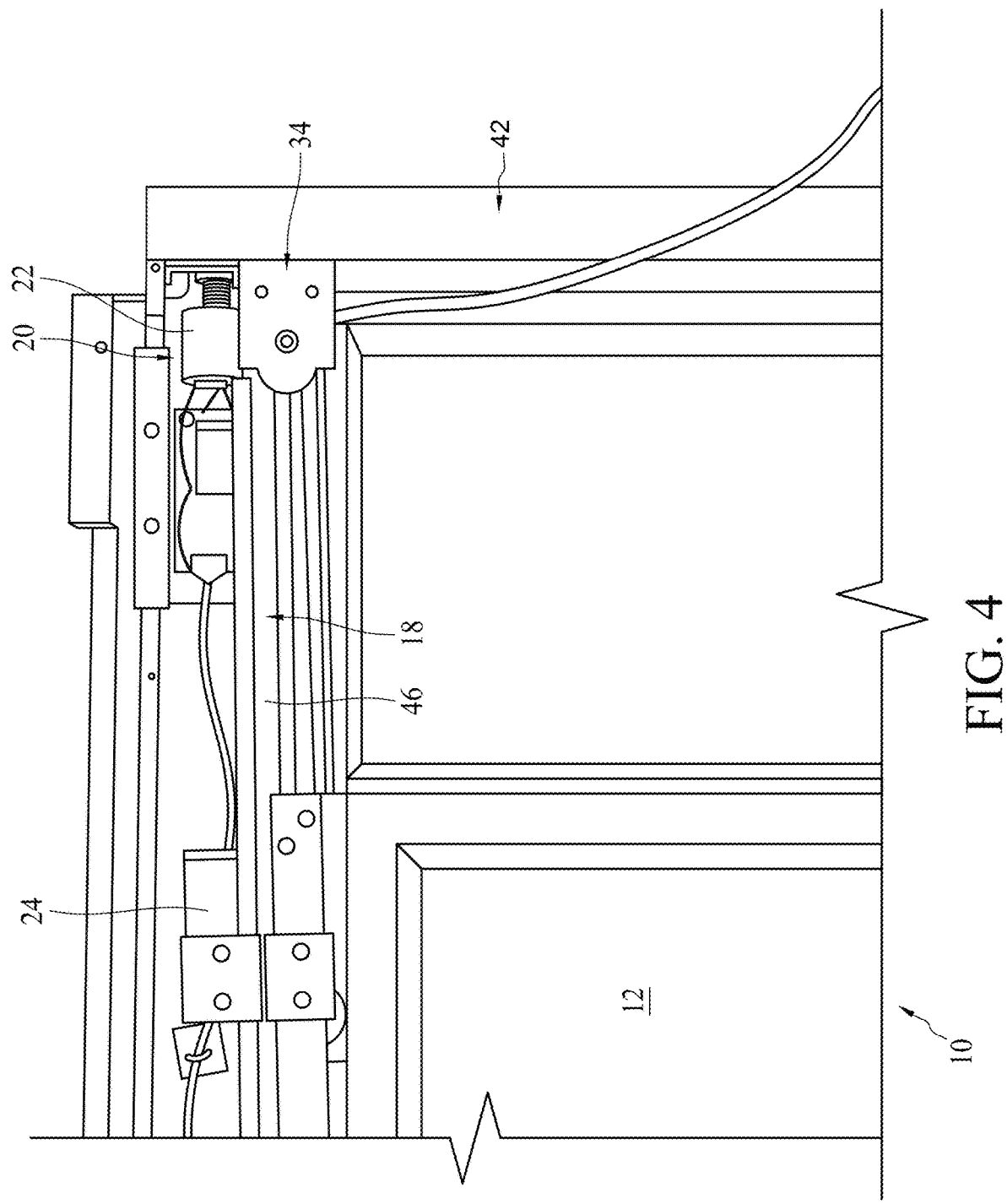
FIG. 4 illustrates a focused front view of a portion of a window assembly according to some embodiments of the present disclosure.
Figure 5:
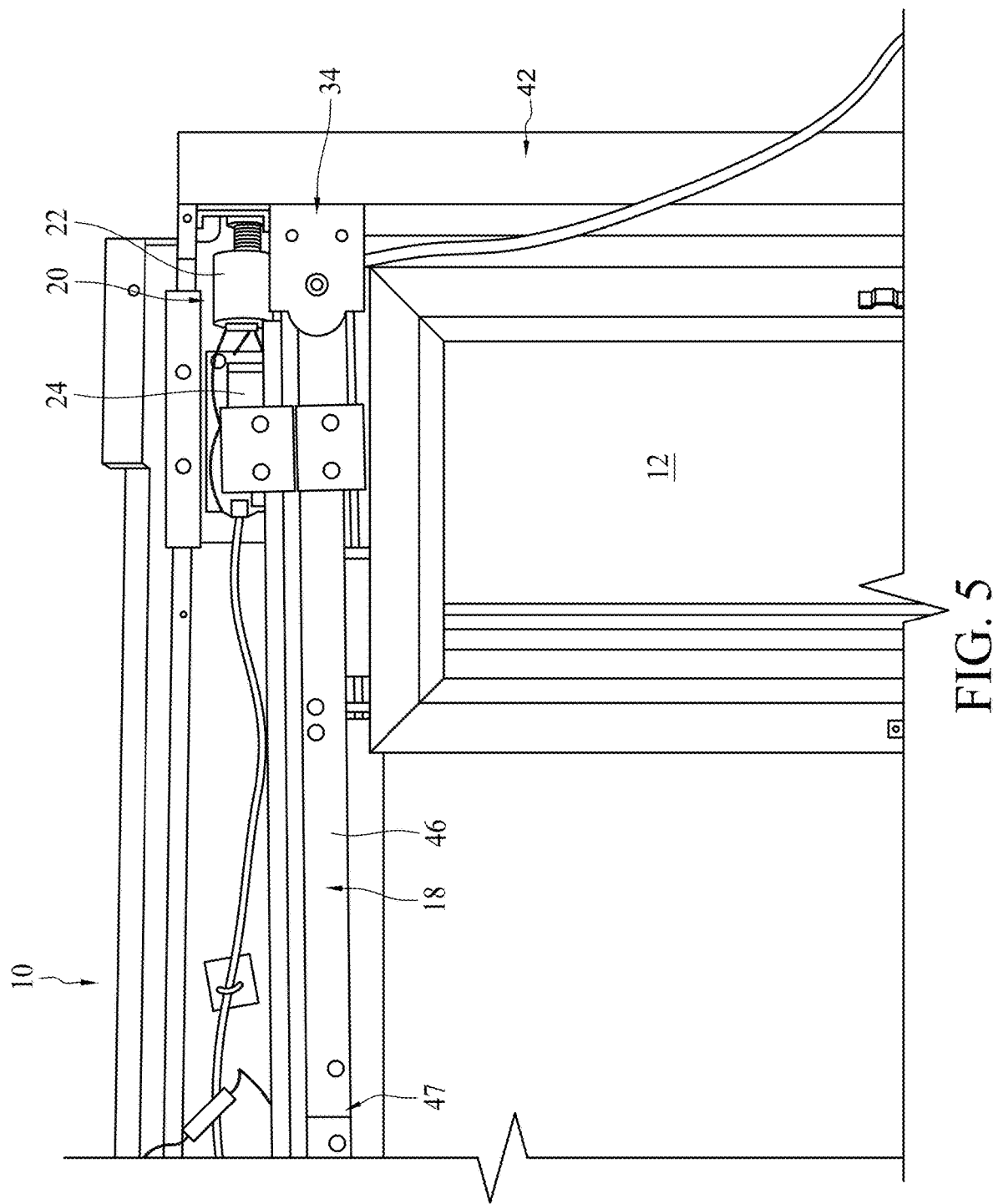
FIG. 5 illustrates a focused front view of a portion of a window assembly according to some embodiments of the present disclosure.
Figure 6:
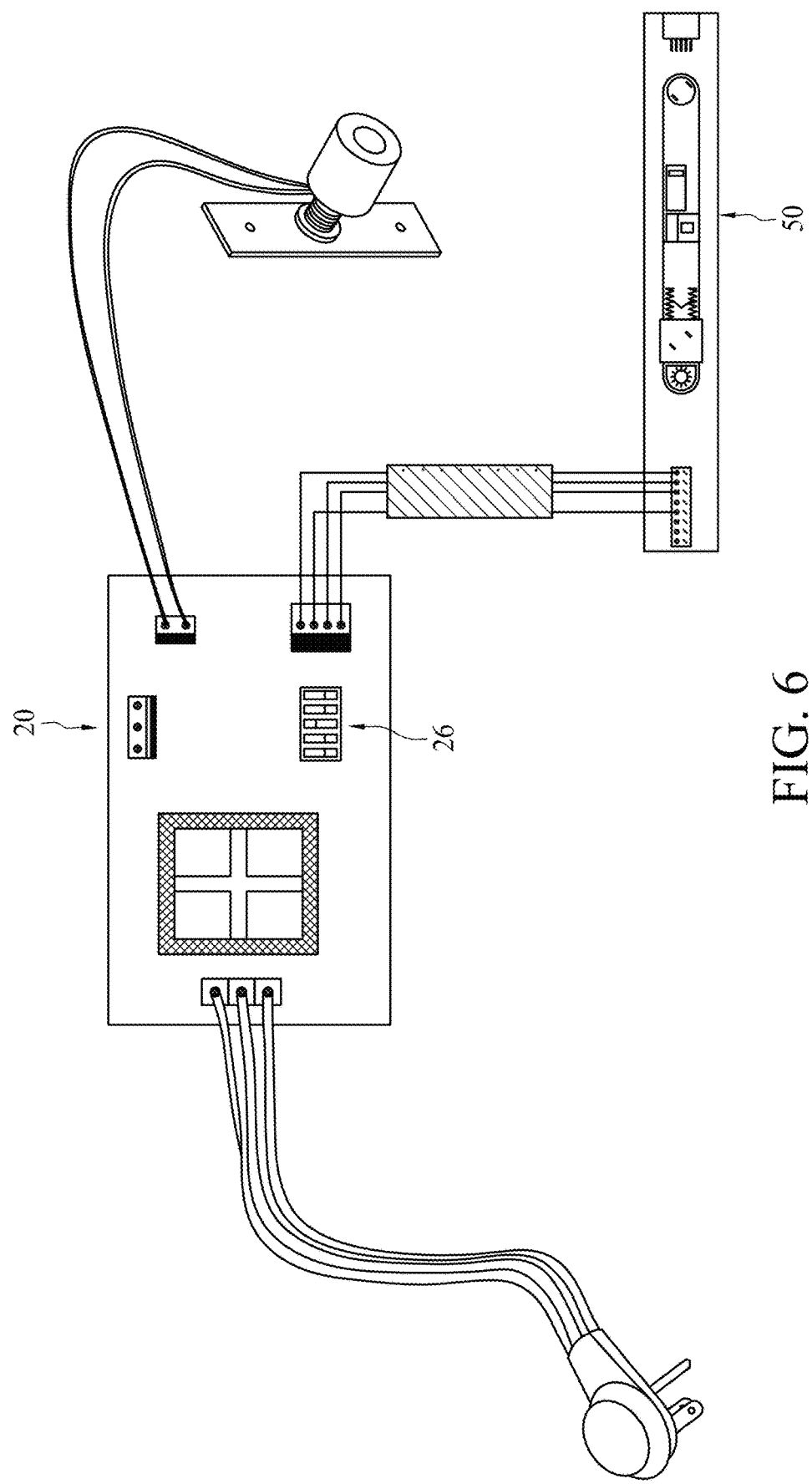
FIG. 6 illustrates a schematic view of a sensor, a magnet, and a controller of a window assembly according to some embodiments of the present disclosure.

A magnet assembly 20 is illustrated in FIGS. 4-6. The magnet assembly 20 generally includes an electrically controlled magnet 22, a magnetic contact 24, and a controller 26 in communication with the magnet 22. In one preferred embodiment, the magnet 22 is coupled to one of the door 12 and the window frame 16, and the magnetic contact 24 is connected to the other of the door 12 and the window frame 16. The magnet 22 and the magnetic contact 24 are positioned so that the magnetic contact 24 is located proximate to the magnet 22, or even in contact with the magnet 22, when the door 12 is in the open position. As shown in FIGS. 4 and 5, the magnet 22 is affixed to one of the side members 42 of the window frame 16, and the magnetic contact 24 is affixed at the top of the door 12. It is understood that the magnet 22 and the magnetic contact 24 can be positioned at either the left or right side of the window assembly 10 as depicted in FIGS. 1-5. In one embodiment, the magnet 22 is a solenoid electromagnet, which can be magnetized by energizing the magnet 22, i.e., flowing an electric current therethrough, and de-magnetized by de-energizing the magnet 22, i.e., shutting off the electric current. It is understood that the magnet is of sufficient strength to hold the door. One example of a suitable electromagnet is a round island pole magnet having a holding strength of 40 lbs.

The magnetic contact 24 can generally be any magnetic or magnetizable element. The magnetic contact shown in FIGS. 4 and 5 is a block of magnetically-attractable metal, such as steel, and is affixed to the door 12 proximate to the top of the door 12. However, the contact 24 could also be a different type of magnetic or magnetizable element, such as a permanent or electrically-controllable magnet.

The controller 26 is in communication with the magnet 22 and controls the magnetization of the magnet 22 between an active state and an inactive state. In the active state, the magnet 22 is magnetized and attracts the magnetic contact 24 on the door 12, and in the inactive state, the magnet 22 is generally not magnetized, or at least not sufficiently magnetized to hold the door 12 and prevent the door 12 from closing. However, in another embodiment, the magnet 22 may be magnetized in the inactive state, but having the polarity reversed from that of the active state. Reversing the polarity of the magnet in the inactive state can be useful, for example, when a permanent magnet is used as the magnetic contact 24. Due to the positioning of the magnet 22 and the magnetic contact 24, when the magnet 22 is in the active state and the door 12 is in the open position, the magnet 22 and the magnetic contact 24 form a magnetic connection, securing the door 12 in the open position. When the magnet 22 is changed to the inactive state, the door 12 is released, and closes automatically. Electromagnets can still retain some of their magnetism after the magnet 22 is de-energized, particularly after a long period of use, and this residual magnetism can sometimes be sufficient to hold the door 12 and prevent its release. Accordingly, in one embodiment where the magnet 22 is an electromagnet, when the magnet 22 is changed to the inactive state, the controller 26 controls the magnet 22 to be pulsed with a reverse current to briefly reverse the polarity of the magnet 22, which moves this residual magnetism and allows the door 12 to be cleanly and consistently released when the magnet 22 is de-energized. However, in another embodiment, the magnet 22 is controlled to the inactive state simply by de-energizing the magnet 22.

The controller 26 can be any suitable control device. In one exemplary embodiment, the controller 26 contains a microprocessor that receives input from the sensor 50 and controls the magnet 22 to hold the door 12 open for a predetermined time set by DIP (dual in-line package) switches on the circuit board (PCB). If the controller 26 is configured to pulse the magnet 22 with reverse current, as described above, the microprocessor controls the output of two power transistors for that purpose. It is understood that the controller 26 may be integrated into one of the other components of the window assembly 10, such as the magnet 22 or the sensor 50.

In some embodiments, the sensor 50 may be a camera or an infrared detector. The sensor 50 is mounted on or near the window assembly 10 and is adapted to detect the presence (or absence) of a user inside the window assembly 10 or an entity outside the window assembly 10. The entity may be a car in the drive-through lane or a person who is conducting business or otherwise using the window assembly 10 for a task or activity. As shown in FIG. 1, the sensor 50 is mounted on the top member 36 of the window frame 16, allowing the sensor 50 to detect whether a user or an entity is positioned between the sensor 50 and the floor proximate to the window assembly 10. The area between the sensor 50 and the floor proximate to the window assembly 10 is referred to herein as a detection area. In one embodiment, the sensor 50 uses infrared (IR) or other reflectable energy waves for this purpose. The sensor 50 may further be modified and adjusted to change the size of the detection area. For example, the sensor 50 may be pivotable to adjust the size and/or position of the detection area. In this embodiment, the sensor 50 pointing directly downward would detect the user or the entity directly in front of the doors 12 and 14, but if the sensor 50 is pivoted to angle farther outward from the doors 12 and 14, the detection area would be increased, or at least moved farther from the doors 12 and 14. Accordingly, the sensor 50 and the size and position of the detection area can be adjusted as desired by the user or owner of the window assembly 10.

The sensor 50 is in communication with the controller 26 and the magnet 22. For example, when the sensor 50 detects that the user is present, the magnet 22 is placed in the active state, and when the sensor 50 detects that the user is not present, the magnet 22 is placed in the inactive state. In one embodiment, the controller 26 receives an input from the sensor 50 and control the magnetization of the magnet 22 accordingly. In some embodiments, a sensor 50 may not be present, and the controller 26 may control the magnet 22 in response to different input, such as manual actuation.

In some embodiments, when the sensor 50 detects the presence of the user, the controller 26 may control the magnet 22 to the active state by energizing the magnet 22. Once the door 12 is fully open, the active (magnetized) magnet 22 will attract the magnetic contact 24, creating a magnetic connection between the magnet 22 and the contact 24 and exerting a retaining force upon the contact 24. This retaining force is sufficient to offset the gravitational biasing force imparted by the inclined track 18, and thus, the door 12 is retained in the open position by the magnet 22. When the door 12 is retained in the open position, the pulley assembly 34 also retains the door 14 in the open position. Once the user steps away from the window, leaving the detection area of the sensor 50, the sensor 50 will detect that the user is not present, and the controller 26 will respond by returning the magnet 22 to the inactive state, by briefly reverse-pulsing and then de-energizing the magnet 22 as described above. This releases the magnetic connection between the magnet 22 and the magnetic contact 24, which eliminates the retaining force on the door 12, and the gravitational biasing force returns the doors 12 and 14 to the closed positions. The controller 26 may be configured to delay changing the magnet 22 to the inactive state for a pre-set time period after the sensor 50 detects that the user is not present. This configuration permits the user to briefly leave and re-enter the detection area without creating the need to re-open the door, such as to quickly grab an ordered item or condiment package. In other embodiments, the window assembly 10 may be designed to allow for operation by users on either or both sides of the window assembly 10.

Figure 7:
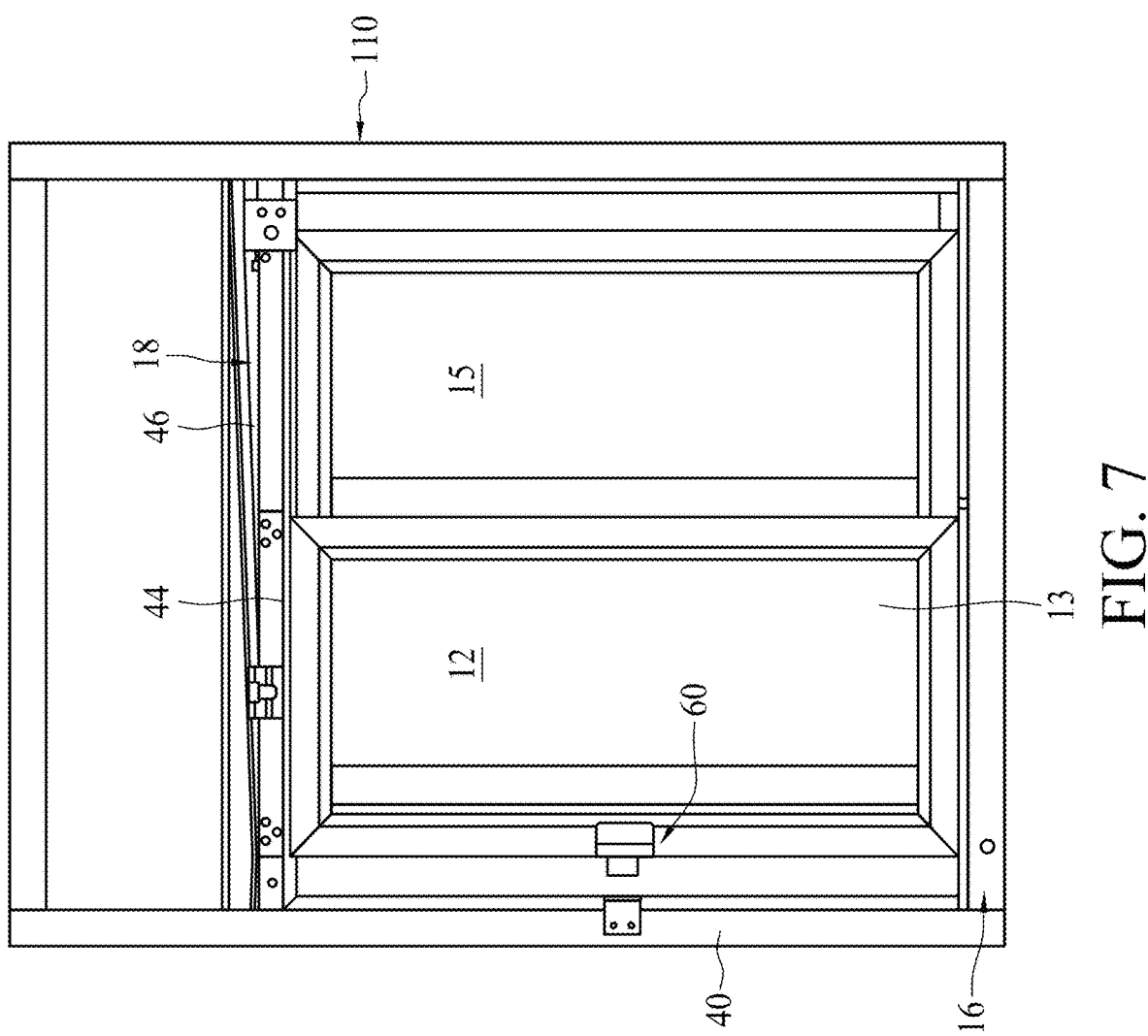
FIG. 7 illustrates a partially-revealed front view of a window assembly according to some embodiments of the present disclosure.
Figure 8:
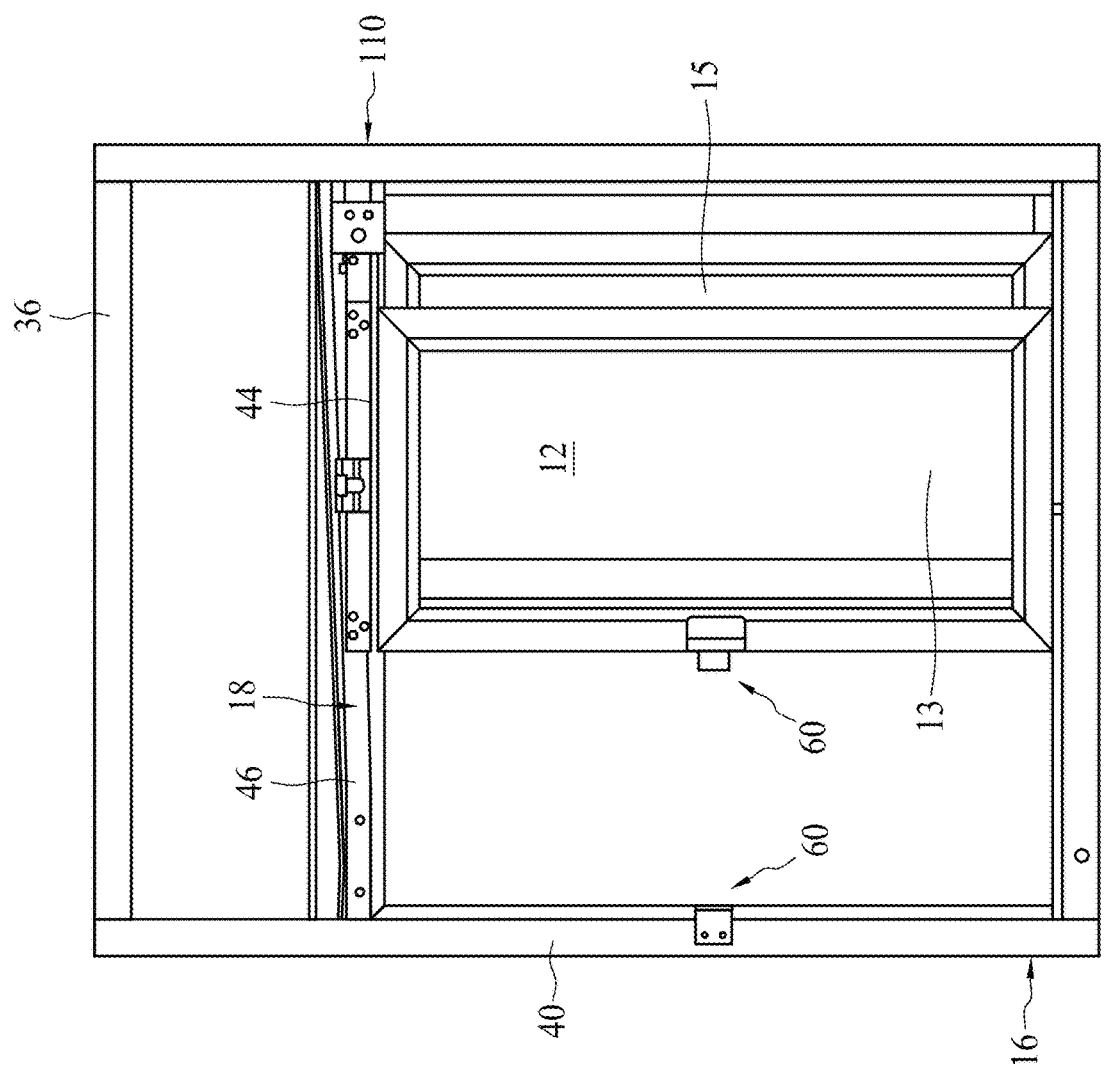
FIG. 8 illustrates a partially-revealed front view of a window assembly according to some embodiments of the present disclosure.

In some embodiments, the doors 12 and 14 may be mounted differently, and may be mounted in a swinging arrangement rather than a sliding arrangement. In some embodiments described below and shown in FIGS. 7 and 8, a window assembly 110 has only a single door 12, rather than two doors 12 and 14 as shown in the window assembly 10 of FIGS. 1 to 3. Other components of this window assembly 110 are similar to those described herein with respect to the window assembly 10 and are consistently identified by the same reference numerals. The magnet 22 and the magnet contact 24 can be positioned in the same configuration relative to the door 12 on the window assembly 10. The door 12 is illustrated in the open position in FIG. 8, and in approximately the closed position in FIG. 7. It is understood that certain components of the window assembly 110 are different in form and/or function than those components of the window assembly 10, and that some components may be absent, due to the nature of the window assembly 110. For example, the window assembly 110 will have a track 18 having only a single inclined arm 46 that is inclined toward the side member 40 of the window frame 16, rather than toward a center point 47 as in the window assembly 10. Thus, in the window assembly 110, the closed position of the door 12 is resting against the side member 40, rather than another door. Additionally, no pulley assembly is necessary in the window assembly 10. Further differences between the two window assemblies 10, 110 are readily apparent to one skilled in the art. A more detailed example of such a single-door window assembly is shown in U.S. Pat. No. 5,970,657, which is incorporated by reference herein and made part hereof. The window assembly 10 provides many benefits and advantages. The window assembly 10 can be used in a variety of applications, for example, as a service window for a drive-through service at a restaurant, grocery store, pharmacy, or other business. When a user opens the window assembly 10 to perform an action, such as servicing a customer, the window will remain open for as long as the user remains at the window. This allows the user to perform actions using both hands, and other positioning that would cause difficulties in holding the window open. Once the user leaves the window, such as when a transaction has been completed, the window will close automatically, which is desirable for many reasons, such as keeping insects and pollutants out and controlling the interior temperature of the establishment. The window assembly uses less electricity than windows with opening and/or closing mechanisms, since electricity is only used to operate the sensor and to hold the window open. Further, the window assembly is lower-profile, using more glass and less metal than prior window assemblies. Still other benefits and advantages are provided.

Figure 9:
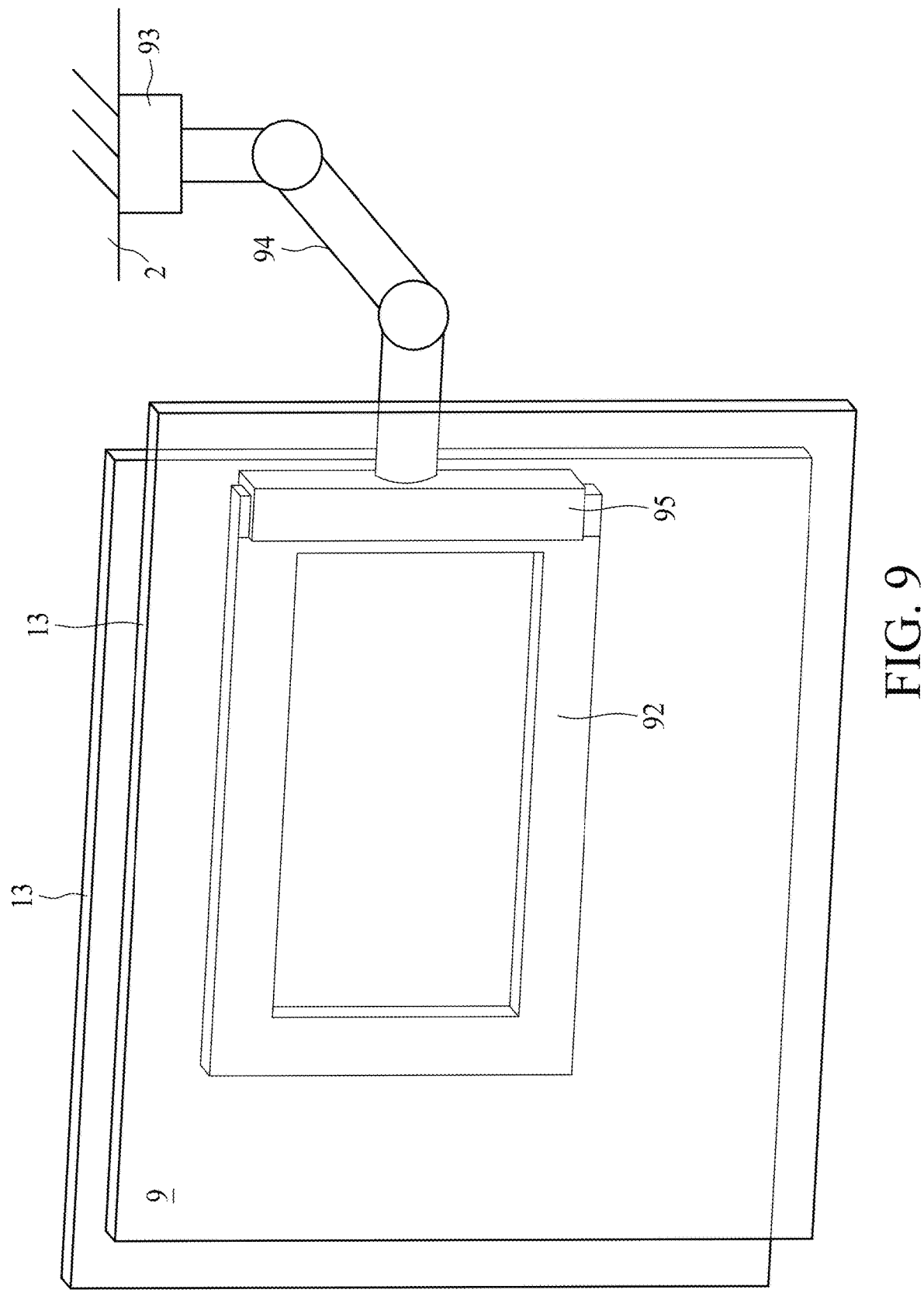
FIG. 9 illustrates a display apparatus arranged between two panes according to some embodiments of the present disclosure.

FIG. 9 illustrates a display apparatus 9, which may be arranged with the window assembly 10 or 110 shown in any of FIGS. 1-3, 7, and 8. The display apparatus 9 includes a display module 92, a base 93, an adjustable arm 94, and a bracket 95. The display module 92 is disposed at a space between two panes 13 when window assembly 10 or 110 is open. For example, the display module 92 may be disposed at a space between the pane 13 of the door 12 and the pane 13 of the panel 15 shown in FIG. 1 when the door 12 is opened (e.g., the open position shown in FIG. 3); the display module 92 may be disposed at a space between the pane 13 of the door 12 and the pane 13 of the panel 15 shown in FIG. 7 when the door 12 is opened (e.g., the open position shown in FIG. 8). The display module 92 may display menus or advertisements thereon. The thickness of the display module 92 and the thickness of the adjustable arm 94 are smaller than the distance between the two panes 13.

The luminous flux of the display module 92 may be greater than 500 lm, 700 lm, or 1500 lm, so as to ensure that the customer outside the window 10 can see the content shown on the display module 92 clearly.

The base 93 of the display apparatuses 9, 9', and 9" is secured to a wall 2. The wall 2 may be a wall on which the window assembly 10 or 110 is mounted, or a ceiling or a floor near the window assembly 10 or 110.

Figure 10:
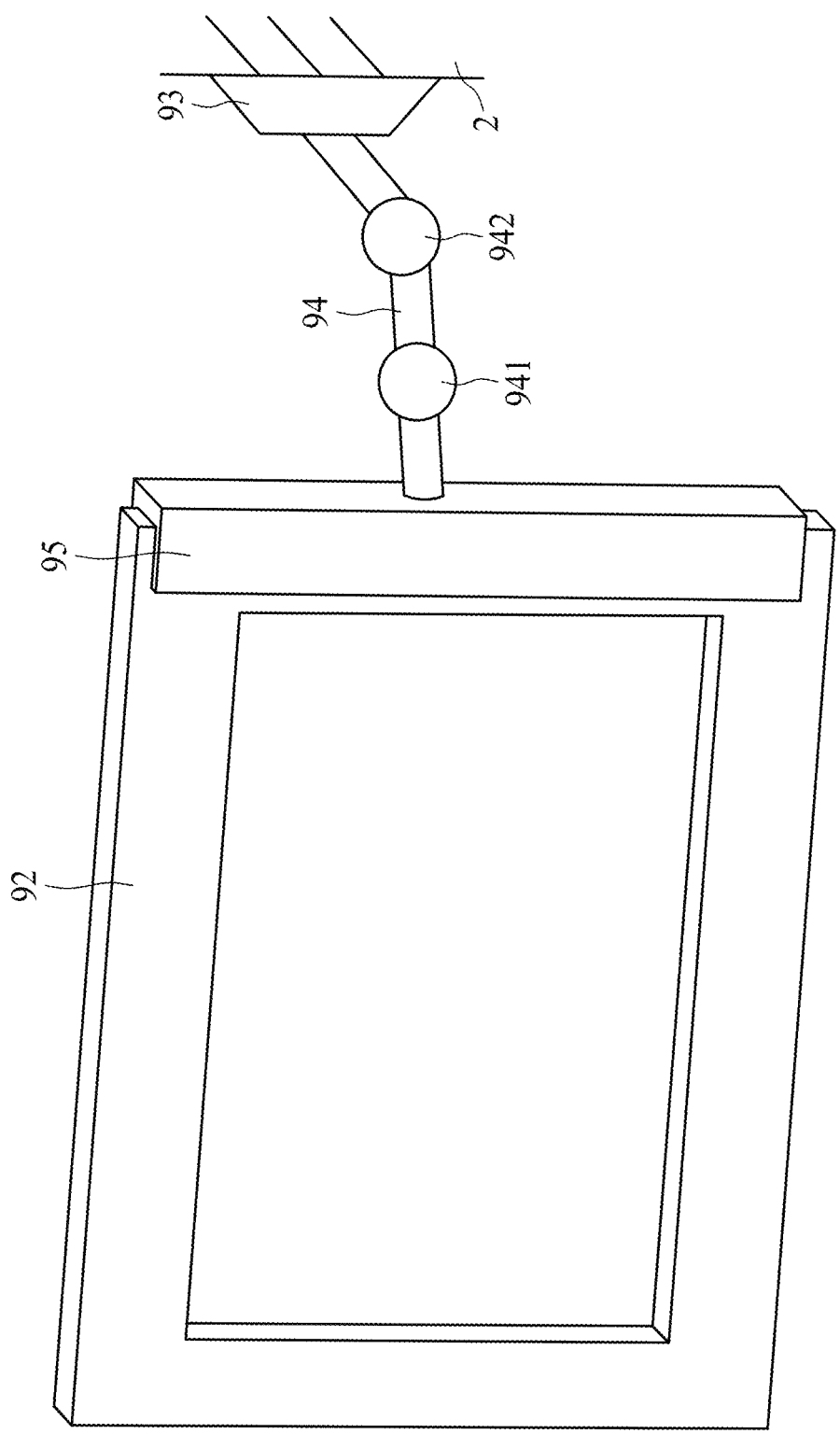
FIG. 10 illustrates a schematic view of a display apparatus according to some embodiments of the present disclosure.
Figure 11:
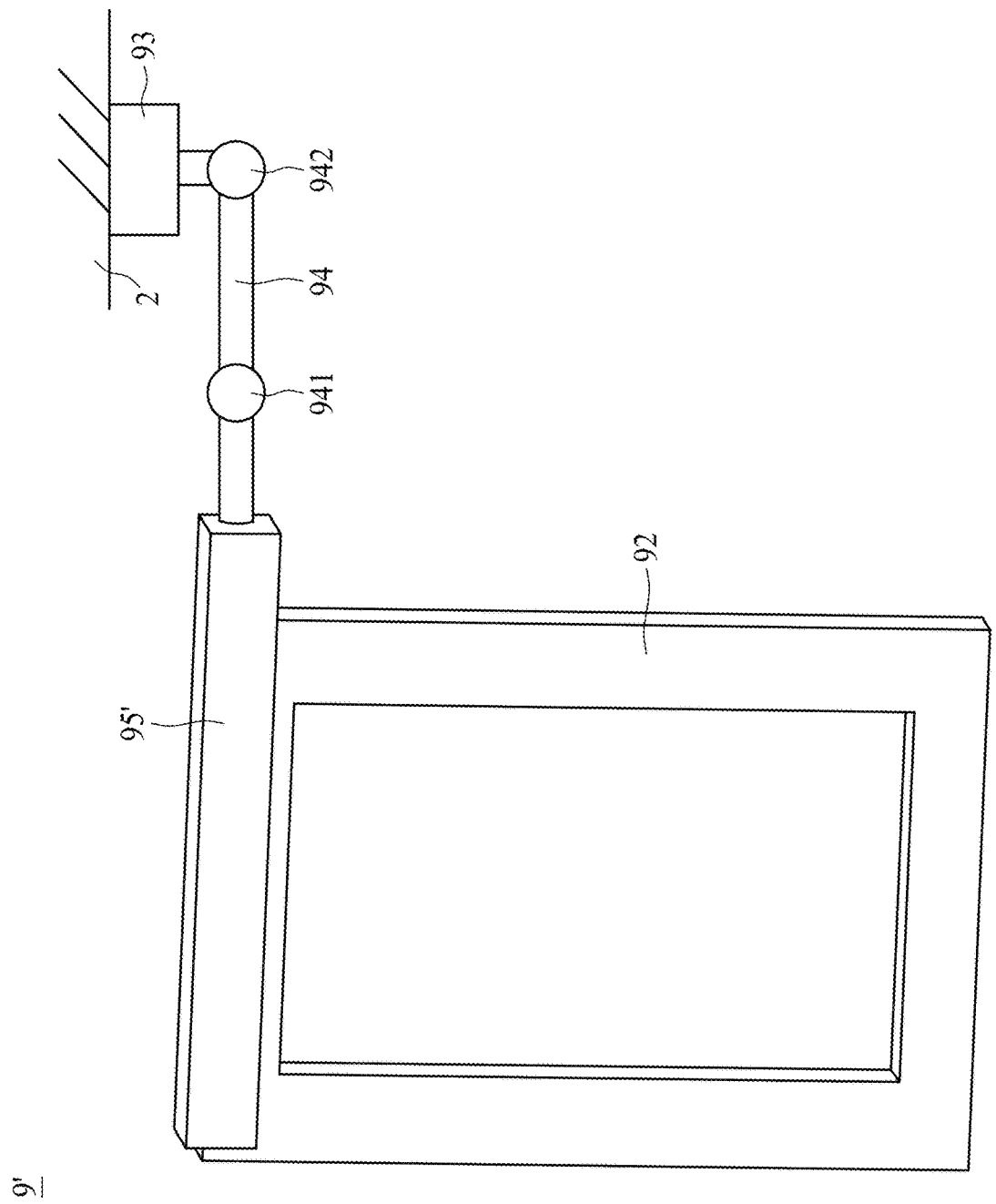
FIG. 11 illustrates a schematic view of a display apparatus according to some embodiments of the present disclosure.
Figure 12:
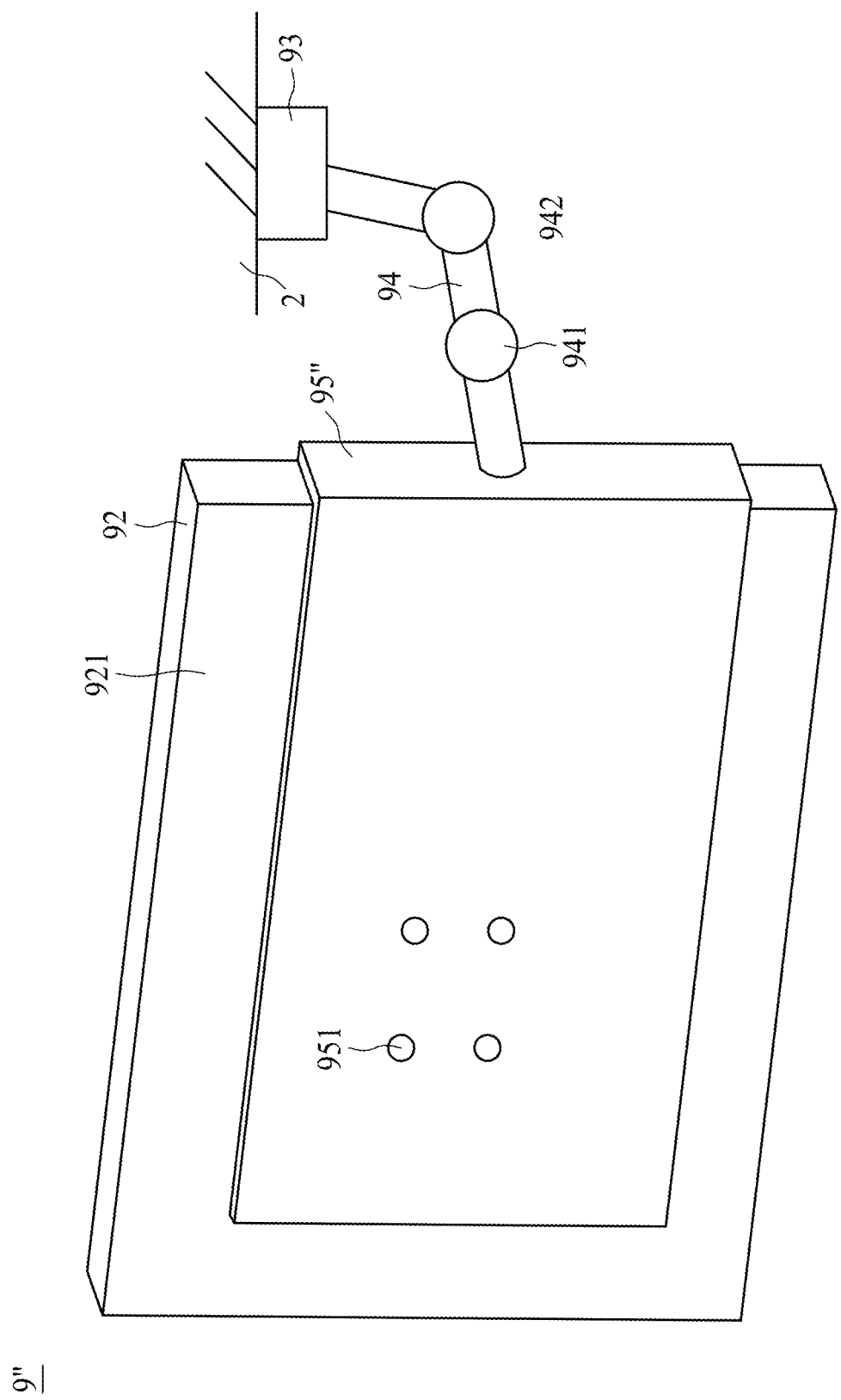
FIG. 12 illustrates a schematic view of a display apparatus according to some embodiments of the present disclosure

FIGS. 10-12 illustrate more detailed structures of the display apparatuses 9, 9', and 9". Each of the display apparatuses 9, 9', and 9" has an adjustable arm 94 with two ends. One end is connected to the base 93. In some embodiments, as shown in FIG. 10, the other end of the adjustable arm 94 is connected to the display module 92 of the display apparatus 9 through the bracket 95. In some embodiments, as shown in FIG. 11, the other end of the adjustable arm 94 is connected to the display module 92 of the display apparatus 9' through the bracket 95'. In some embodiments, as shown in FIG. 12, the other end of the adjustable arm 94 is connected to the display module 92 of the display apparatus 9" through the bracket 95". The adjustable arm 94 includes pivotably adjustable joints. FIGS. 10-12 show that the adjustable arm 94 includes, but is not limited to, two joints, such as pivotably adjustable joints 941 and 942. In FIGS. 10-12, the pivotably adjustable joint 941 is near the display module 92, and the pivotably adjustable joint 942 is near the base 93. In some embodiments, the adjustable arm 94 may include only one joint at either the end near the display module 92 or the end near the base 93. In some embodiments, the adjustable arm 94 may have more than two joints.

With the adjustable arm 94, the display module 92 can be movably arranged within or outside of a space between two panes. For example, if the user intends to clean the window, the user can move the display module 92 outside of the space between the two panes. Furthermore, since the display module 92 is disposed within the space between the two panes when the window is open, it would not take any space behind the window considering that the space behind the window may be very limited. Each of the display apparatus 9, 9', and 9" can be arranged between panes 13 as shown in FIG. 9.

The display apparatuses 9' and 9" include components similar to those of the display apparatus 9 except for the brackets 95' and 95". Returning to FIG. 10, the bracket 95 is attached to a side of the display module 92. In some embodiments, a section of the adjustable arm 94 attached to the bracket 95 is vertical to a longitudinal axis of the bracket 95. For example, a section of the adjustable arm 94 attached to the bracket 95 may be the section between the end of the adjustable arm 94 near the display module 92 and the pivotably adjustable joint 941 of the adjustable arm 94 as shown in FIG. 10. In some other embodiments (not shown in FIG. 10), the pivotably adjustable joint 941 is directly attached to the bracket 95 without the section.

Returning to FIG. 11, the bracket 95' is attached to a side of the display module 92. A section of the adjustable arm 94 attached to the bracket 95' is parallel to a longitudinal axis of the bracket 95'. For example, a section of the adjustable arm 94 attached to the bracket 95' may be the section between the end of the adjustable arm 94 near the display module 92 and the pivotably adjustable joint 941 of the adjustable arm 94 as shown in FIG. 11. In some other embodiments (not shown in FIG. 11), the pivotably adjustable joint 941 is directly attached to the bracket 95' without the section.

Returning to FIG. 12, the bracket 95" is L-shaped. The bracket 95" includes two portions. The two portions of the bracket 95" are vertical to each other. One portion of the bracket 95" is attached to the back surface 921 of the display module 92, and the other portion of the bracket 95" is attached to a side of the display module 92. One end of the adjustable arm 94 is connected to the portion attached to the side of the display module 92. In some embodiments, the portion of the bracket 95" is attached to the back surface of the display module 92 by mounting interfaces 951, such as screws. The bracket 95", the display module 92, and the mounting interfaces 951 all comply with the VESA (Video Electronics Standards Association) mounting standards. In some embodiments, the adjustable arm 94 is attached to the bracket 95" with or without a section.

Figure 13:
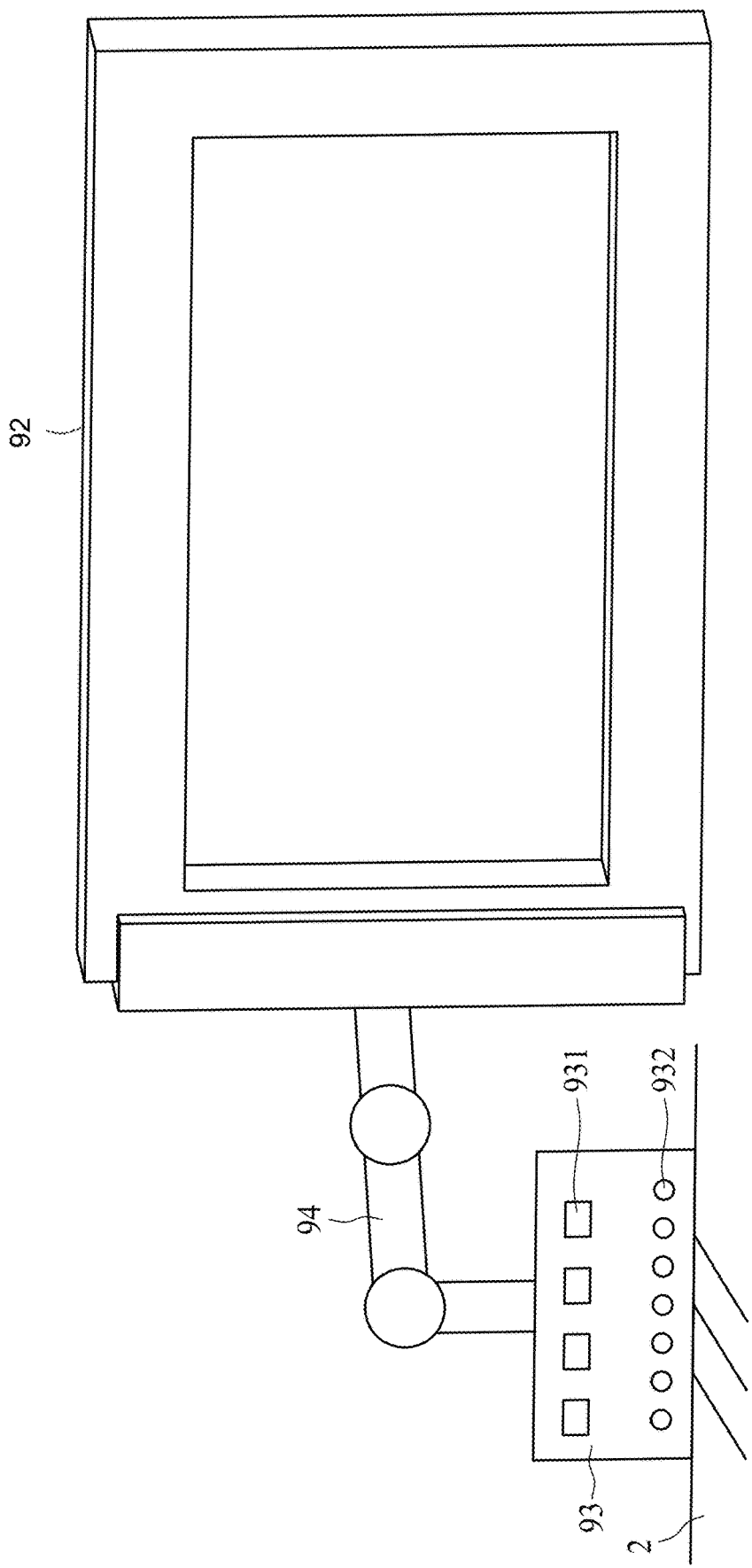
FIG. 13 illustrates a schematic view of a display apparatus according to some embodiments of the present disclosure.

In some embodiments, each of the display apparatus 9, 9', and 9" includes a control circuit. In some embodiments, the control circuit is disposed in the base 93. FIG. 13 shows the base 93 secured to a wall 2. The base 93 includes input/output ports 931 and control interfaces 932. The input/output ports 931 may be used to connect external media or other input/output devices. A user may configure the control circuit (within the base 93) and/or the display apparatus 9, 9', or 9" through the control interface 932. The control circuit (within the base 93) and the display module 92 are electrically connected via a cable arranged within the adjustable arm 94. In some other embodiments, the cable is arranged outside of and extends along the adjustable arm 94. The cable includes one or more power wires and one or more signal wires, in which the power wires are used to provide power and the signal wires are used to transmit/receive control signals or data.

The control circuit disposed in the base 93 controls the display apparatus 9, 9', or 9". For example, the control circuit may control the content shown on the display module 92. The user may change or modify the content shown on the display module 92 through the input/output ports 931 or the control interface 932.

In some embodiments, the control circuit disposed in the base 93 is in communication with the controller 26 as shown in FIG. 6. In this case, the control circuit disposed in the base 93 can receive inputs from the sensor 50 through the controller 26. The control circuit disposed in the base 93 can receive signals indicating whether an entity is present in front of the window assembly 10 (or 110) and/or the display apparatus 9 (9' or 9"). In some embodiments, if the control circuit disposed in the base 93 receives signals indicating that no entity is present in front of the window assembly 10 (or 110) and the display apparatus 9 (9' or 9"), the control circuit disposed in the base 93 may send a signal to make the display module 92 switch off the screen, work in the sleep mode or display specific content. If the control circuit disposed in the base 93 receives signals indicating that an entity is present in front of the window assembly 10 (or 110) and/or the display apparatus 9 (9' or 9"), the control circuit disposed in the base 93 may send a signal to wake up the display module 92 or switch the displayed content.

Figure 14:
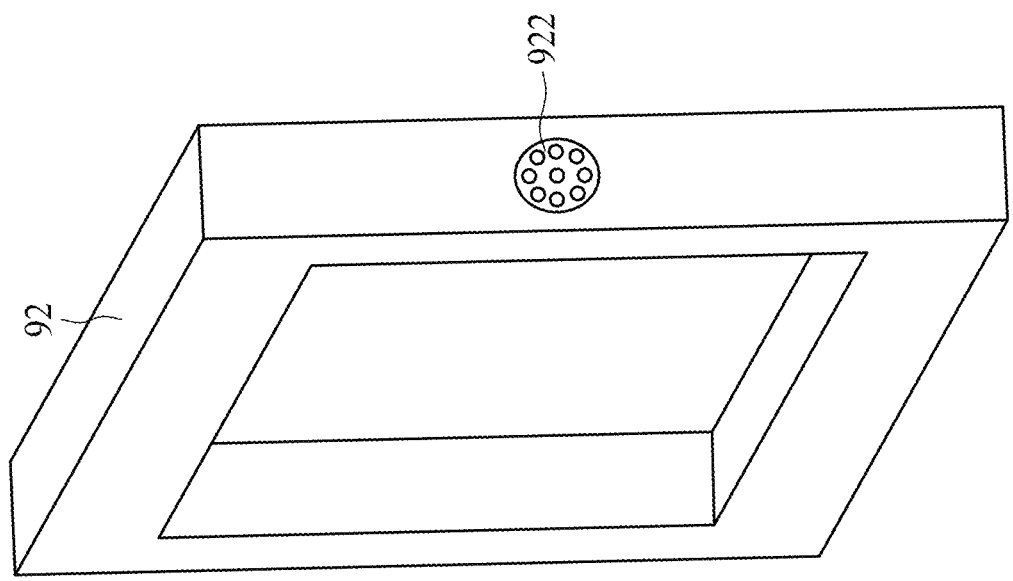
FIG. 14 illustrates a display module according to some embodiments of the present disclosure.
Figure 15:
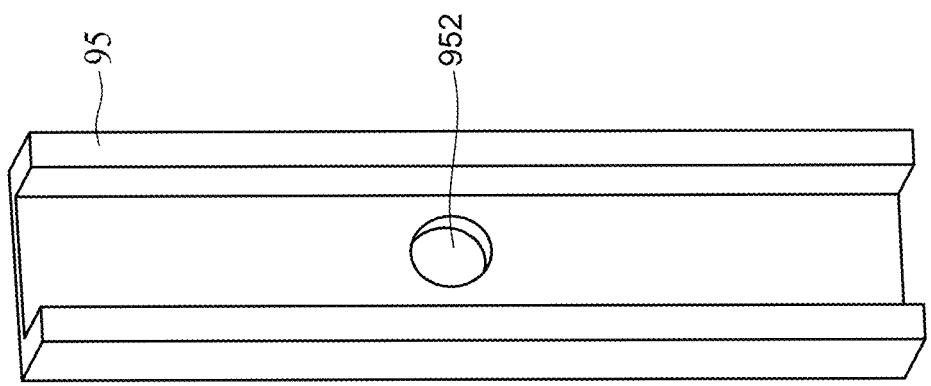
FIG. 15 illustrates a bracket according to some embodiments of the present disclosure.

Referring to FIGS. 14 and 15, the display module 92 includes a connector 922, and the bracket 95 includes a hole 952. Through the hole 952, the connector 922 is electrically connected to the control circuit 93 via the cable. The bracket 95 shown in FIG. 15 is attached to the display module 92 shown in FIG. 14, and the hole 952 exposes the connector 922 for being connected by the cable. It should be noted that the connection between the control circuit 93 and the display module 92 is not limited in the configuration shown in FIGS. 14 and 15. Persons skilled in the art can change the type of connection between the control circuit 93 and the display module 92 by modifying the appearance and/or location of the connector 92 and the appearance of the bracket 95.

As used herein, the singular terms "a," "an," and "the" may include plural referents unless the context clearly indicates otherwise. For example, reference to an electronic device may include multiple electronic devices unless the context clearly indicates otherwise.

As used herein, the terms "connect," "connected," and "connection" refer to an operational coupling or linking. Connected components can be directly or indirectly coupled to one another through, for example, another set of components.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless otherwise specifically indicated herein, the order and grouping of the operations are not limitations of the present disclosure.

What is claimed is:

1. A display apparatus to be arranged between two panes, comprising:
   a display module;
   a base to be secured to a wall;
   an adjustable arm having a first end and a second end, wherein the second end is connected to the base); and
   a bracket attached to the display module, wherein the first end of the adjustable arm is connected to the display module through the bracket, so that the display module can be removably arranged within or outside of a space between the two panes;
   wherein a thickness of the display module and a thickness of the adjustable arm are smaller than a distance between the two panes, and at least one of the two panes is movable.

2. The display apparatus of claim 1, further comprising a control circuit, wherein the control circuit is disposed in the base.

3. The display apparatus of claim 2, further comprising a cable in the adjustable arm for electrically connecting the display module and the control circuit.

4. The display apparatus of claim 1, wherein the adjustable arm comprises a first joint near the first end of adjustable arm.

5. The display apparatus of claim 4, wherein the bracket is attached to a side of the display module, and a section between the first end of the adjustable arm and the first joint of the adjustable arm is vertical to a longitudinal axis of the bracket.

6. The display apparatus of claim 4, wherein the bracket is attached to a side of the display module, and a section between the first end of the adjustable arm and the first joint of the adjustable arm is parallel to a longitudinal axis of the bracket.

7. The display apparatus of claim 1, wherein the adjustable arm comprises a second joint near the second end of adjustable arm.

8. The display apparatus of claim 1, wherein:
   the bracket is L-shaped and comprises a first portion and a second portion vertical to the first portion;
   the first portion of the bracket is attached to a back surface of the display module;
   the second portion of the bracket is attached to a side of the display module; and
   the first end of the adjustable arm is connected to the second portion of the bracket.

9. The display apparatus of claim 1, wherein the luminous flux of the display module is greater than 500 lm, 700 lm, or 1500 lm.

* * * * *